(12) United States Patent
Richter et al.

(10) Patent No.: US 12,205,967 B2
(45) Date of Patent: Jan. 21, 2025

(54) AVALANCHE PHOTODIODE ARRAY

(71) Applicant: Max-Planck-Gesellschaft zur Förderung der Wissenschaften e.V., Munich (DE)

(72) Inventors: Rainer Richter, Munich (DE); Florian Schopper, Munich (DE); Jelena Ninkovic, Munich (DE); Alexander Bähr, Gröbenzell (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 597 days.

(21) Appl. No.: 17/600,637

(22) PCT Filed: Mar. 30, 2020

(86) PCT No.: PCT/EP2020/058904
§ 371 (c)(1),
(2) Date: Oct. 1, 2021

(87) PCT Pub. No.: WO2020/201189
PCT Pub. Date: Oct. 8, 2020

(65) Prior Publication Data
US 2022/0216245 A1     Jul. 7, 2022

(30) Foreign Application Priority Data
Apr. 2, 2019     (DE) ............... 10 2019 204 701.7

(51) Int. Cl.
*H01L 27/146*     (2006.01)
*H01L 31/107*     (2006.01)

(52) U.S. Cl.
CPC ...... *H01L 27/1461* (2013.01); *H01L 27/1463* (2013.01); *H01L 27/14683* (2013.01);
(Continued)

(58) Field of Classification Search
CPC ............ H01L 27/1461; H01L 27/1463; H01L 27/14683; H01L 27/14634;
(Continued)

(56) References Cited

U.S. PATENT DOCUMENTS

| 4,587,544 A | 5/1986 | Webb |
| 2011/0272561 A1 | 11/2011 | Sanfilippo et al. |

(Continued)

FOREIGN PATENT DOCUMENTS

| CN | 103887362 | * | 8/2016 | ........... H01L 31/107 |
| CN | 103887362 B | * | 8/2016 | ..... H01L 31/035272 |

(Continued)

OTHER PUBLICATIONS

Hamamatsu product information https://www.hamamatsu.com/eu/en/product/type/S8550-02/index.html (English) Oct. 2012.
(Continued)

*Primary Examiner* — Tony Ko
(74) *Attorney, Agent, or Firm* — Locke Lord LLP; Scott D. Wofsy; Nicholas J. DiCeglie, Jr.

(57) ABSTRACT

An avalanche photodiode array for detecting electromagnetic radiation comprises: a semiconductor substrate (100) having a first main surface (101) and a second main surface (102), which are opposite one another, a plurality of n-doped anode regions (1) formed at the first main surface (101) and separated from one another by pixel isolation regions (7), a p-doped cathode region (3) arranged at the second main surface (102) opposite the anode regions, a drift region (4) between the plurality of anode regions (1) and the cathode region (3), and a p-doped multiplication layer (2) arranged below the plurality of anode regions (1) and below the pixel isolation regions (7), and is characterized by an n-doped field reduction layer (9) arranged below the plurality of
(Continued)

anode regions (1) and the pixel isolation regions (7) and above the multiplication layer (2).

20 Claims, 7 Drawing Sheets

(52) U.S. Cl.
CPC .. *H01L 27/14634* (2013.01); *H01L 27/14643* (2013.01); *H01L 31/107* (2013.01)

(58) Field of Classification Search
CPC ............. H01L 27/14643; H01L 31/107; H01L 27/14636; H01L 27/14689
See application file for complete search history.

(56) References Cited

U.S. PATENT DOCUMENTS

| | | |
|---|---|---|
| 2012/0267746 A1 | 10/2012 | Sanfilippo et al. |
| 2014/0291481 A1 | 10/2014 | Zhang et al. |
| 2018/0097132 A1 | 4/2018 | Chen et al. |
| 2019/0020836 A1 | 1/2019 | Kasuga et al. |
| 2022/0238744 A1* | 7/2022 | Röhrer ................ H01L 27/1446 |
| 2023/0065356 A1* | 3/2023 | Giacomini ........ H01L 27/14643 |

FOREIGN PATENT DOCUMENTS

| | | |
|---|---|---|
| JP | 2014225647 A | 12/2014 |
| WO | 2018158631 A1 | 9/2018 |

OTHER PUBLICATIONS

N. Moffat et al., "Low Gain Avalanche Detectors (LGAD) for particle physics and synchrotron applications", Journal of Instrumentation, vol. 13, Mar. 2018 (English).

G. Pellegrini et al., "Recent Technological Developments on LGAD and iLGAD Detectors for Tracking and Timing Applications", arXiv.org > physics > arXiv:1511.07175 (English).

T. Gg. Tsuru et al., "Development and Performance of Kyoto's X-ray Astronomical SOI pixel (SOIPIX) sensor", arXiv.org > astro-ph > arXiv:1408.4556v1.

International Search Report issued in PCT/EP2020/058904, dated May 15, 2020.

* cited by examiner

AVALANCHE PHOTODIODE ARRAY

CROSS REFERENCE TO RELATED APPLICATIONS APPLICATION

This application is a U.S. National Phase Application filed under 35 U.S.C. § 371, based on International Patent Application No. PCT/EP2020/058904, filed Mar. 30, 2020, which claims priority to German Patent Application No. 10 2019 204 701.7, filed Apr. 2, 2019. The entire contents of these applications are incorporated herein by reference.

The present application refers to a matrix arrangement of silicon avalanche photodiodes (APDs)—in the following referred to as "APD array" for a detection of radiation, in particular electromagnetic radiation.

Avalanche photodiodes use impact ionization of electric charge carriers for an amplification of the signal. They are applied as sensors for the detection of photons, which photons transfer their energy to the semiconductor crystal and thereby generate electron-hole pairs. For a detection of light in the visible range (UV to near infrared) so-called Reach-Through-APDs (RT-APDs) made of silicon are particularly suitable as in these diodes light impinges at the backside of the chip on a light entrance window which is unstructured and adapted to the wavelength of the light to be detected. FIG. 6 shows by way of an example the basic design of an RT-APD and the electric field distribution.

In the left half of FIG. 7, a cut through a single APD perpendicular to the chip surfaces is schematically shown. At the bottom side, which usually is regarded as chip front side, a heavily n-doped anode region 61 can be seen and at the opposed chip surface, which usually is regarded as chip backside, a heavily p-doped cathode region 62 can be seen. A weakly p-doped drift region 63 or a drift region 63 having only intrinsic conductivity takes up the major part of the chip substrate. As a result of the very weak doping of the drift region 63, it is completely depleted due the reverse voltage that is applied between anode and cathode during operation. Depending on their wavelength, photons incident on the chip backside (radiation entrance side) are converted in the area of the cathode region 62 or in the drift region 63. In order to generate a sensor signal, the (signal) electrons that are generated must drift in the electric field in the drift region 63 towards the anode region 61 at the chip front side. Here, the intrinsic amplification of the signal is effected by a multiplication layer 64 arranged between the drift region 63 and the anode region 61. Such multiplication layer 64 has a considerably higher p-doping than the drift region 63 and is also completely depleted when the reverse voltage is applied during sensor operation. The right half of FIG. 7 shows the dependence of the field strength from the position relative to the chip front side and backside. Due to the higher p-doping, the electric field strength close to the pn junction is so much increased as compared to the field strength in the drift region that a multiplication of signal electrons occurs due to impact ionization, whereby the intrinsic amplification is effected.

When an APD is operated, basically two different modes are distinguished, the proportional mode and the Geiger mode. In the proportional mode, the applied reverse voltage is lower than the breakdown voltage, in the Geiger mode it is higher than the breakdown voltage. The present application is directed to APDs which are to be operated in the proportional mode, in which the output signal is substantially proportional to the radiant flux.

A specific variant of an RT-APD is a so-called SLIK-APD. Here, SLIK stands for super low ionization k factor, wherein the k factor designates the ratio of the hole ionization rate to the electron ionization rate for a certain electric field strength. Usually, a low value for the k factor is preferred as multiplications that are created by holes do considerably worsen the excess noise of an APD. Therefore, an APD that is operated in the proportional mode ideally has a k factor which is 0, i.e. the amplification is based exclusively on the multiplication of electrons while holes do not contribute. While in silicon RT-APDs k factors down to approximately 0.02 are achieved, k factors which are lower by approximately an order of magnitude can be obtained with SLIK-APDs. Therefore, SLIK-APDs are particularly well-suited for applications requiring a low noise. They take advantage of the fact that for smaller electric field strengths the k factor becomes also smaller. Therefore, in order to compensate for the loss of gain, they have a multiplication layer which is very wide in a direction perpendicular to the chip front side and backside and which typically can extend over some 10 µm.

As impact ionization is a stochastic process, such process leads to an additional noise contribution in signal amplification which in English is designated as "excess noise". Therefore, APDs are mainly used in very fast detector systems (signal provision time in the nanosecond range and below) together with wide-band amplifiers, wherein the excess noise of the APDs is of no consequence as compared to the high white noise of the wide-band amplifiers. It is also advantageous to use APDs in systems with sensor elements having a large input capacitance or in which the performance of the following amplifying elements has to be limited due to lack of space or due to power requirements. A typical example are diode arrays in which a microelectronics chip with integrated read-out electronics is connected to the diodes by means of flip chip technique via so-called bump bonds.

For imaging detectors, image cell matrices (arrays) as large as possible having small sensor pixels are ideal in order to be able to capture an area that is as large as possible with a good position resolution. Silicon pin diode arrays that are suitable for this can be manufactured in sizes of some 10 square centimeters with pixel sizes (p) in the range of 50 µm. Such detector systems are successfully applied in high energy physics and in diverse synchrotron experiments, wherein the position resolution is very good. It is at $p/\sqrt{12}$ or better. However, as pin diodes, in contrast to APDs, do not have an intrinsic signal amplification, the detection of weak and/or fast signals either is not possible at all or is possible only by very elaborate read-out amplifiers. It is a particular problem that the high-quality amplifiers that are needed cannot be integrated in numbers of tens of thousands on a read-out chip due to their requirements of space and power. For example, soft X-ray photons (soft X-rays) generate only a few hundred signal electrons. As the noise (e.g. expressed as equivalent noise charge ENC) of the available read-out electronic chips in the short timespans that are interesting for many applications is also at a few 100 electrons, pin diode arrays accordingly are usually not applicable for the detection of very weak signals.

APDs would solve the problem. However, at the moment they cannot be arranged in large arrays having small pixels (image cells). For example, an APD array, which is commercially available at the time, has 4×8 pixels and a photosensitive area of 1.6×1.6 mm² (Hamamatsu Product Information https://www.hamamatsu.com/eu/en/product/type/S8550-02/index.html). An essential reason for this are the separation regions between the heavily n-doped anodes of neighboring APD pixels (which have a common cathode), the reason being that in order to avoid electrical breakdowns the edges of the anodes of the APD pixels must be surrounded by a relatively large protective structure.

The tendency to breakdowns at the edges of APD pixels is a result of the curvature of the doping profile at the edges of the highly n-doped anodes of the pixels. Due to the resulting increased density of the electric field lines at the edges, without sufficient counter-measures avalanche amplification would occur at the edges of a pixel at lower voltages than inside of a pixel so that the overall amplification properties of the APD would be dominated by its edge region. In the known protective structures, this effect is avoided by a strong reduction of the electric field in the edge region. Charge carrier multiplication occurs only inside of a pixel and is switched off in the edge region.

Therefore, when in an APD pixel array each individual pixel has a protective and insulating region, insensitive dead regions will exist between the sensitive regions of the pixels, whereby the effective signal collecting area of the individual pixels is decreased. The areas of the anodes must be large in comparison to the less sensitive or insensitive areas of the regions between the anodes, so that the dead regions do not dominate the charge collection performance of the whole array. Accordingly, the pixels are large at the expense of position resolution.

Usually, the limitation of the effective charge collection area of the sensor pixels of an APD sensor array is characterized by the fill factor. Here, the fill factor describes the ratio of the sensitive pixel area to the total pixel area. Thus, an ideal sensor array would have the fill factor one.

Also for SLIK-APDs, at the moment there does not exist a satisfactory solution for a pixelated sensor array.

University research works on arrays of avalanche diode arrays having an improved fill factor. Such arrays, which are designated as LGAD (low gain avalanche detector), either have stripe-shaped or pixelated diode arrangements. The main field of application is the detection of ionized particles, e.g. in high energy physics experiments. At the moment there are two approaches:

The classical LGAD uses RT-APDs (see N. Moffat et al., "Low Gain Avalanche Detectors (LGAD) for Particle Physics and Synchrotron Applications", Journal of Instrumentation, Volume 13, March 2018). The fill factor shall be improved by a minimization of protective structures. In the inverted LGAD (G. Pellegrini et al., "Recent Technological Developments on LGAD and iLGAD Detectors for Tracking and Timing Applications, arXiv.org>physics>arXiv: 1511.07175), it is not the anodes that are segmented but the p-doped cathodes. Accordingly, the anodes and the multiplication layer can be designed to be uniform over the whole array and the protective structures can be omitted, so that the fill factor equals 1. However, the disadvantage of this concept is that it is only suitable for the detection of particles, but not as photodetector. As the cathode side has to be structured and metallized—the read-out chip of the pixel detector is located here—it is no longer suitable as light entrance window. When the anode side is used as light entrance window, photons that are converted in the anode are not amplified at all and in case the conversion occurs in the multiplication layer, the amplification varies depending on the depth of the conversion. Therefore, inverted LGADs are only applicable for the detection of particles or at best for the near infrared region.

The flip chip technology has already been mentioned as joining technology between sensor array and read-out electronics. In the process, the sensor and the electronics are manufactured on separate wafers by different semiconductor technologies and afterwards are contacted chip- or wafer-wise with bump bonds or micro-solder connections e.g. solid-liquid interdiffusion bonding (Slid). A newer development goes one step further. In the SOIPIX technology (see e.g. T. Gg. Tsuru et al., "Development and Performance of Kyoto's X-Ray Astronomical SOI Pixel (SOIPIX) Sensor", arXiv.org>astro-ph>arXiv:1408.4556v1), a thin mono-crystalline silicon layer is applied on a sensor pixel wafer which also serves as carrier substrate by means of the SOI method (silicon on insulator). Subsequently, the read-out electronics is integrated into the thin mono-crystalline silicon layer as CMOS transistors. Here, the carrier substrate with the sensor pixels and the thin mono-crystalline silicon layer with the read-out electronics are insulated from each other by an insulating layer made of silicon dioxide. In order to connect the read-out electrodes of the sensor pixels to the corresponding CMOS amplifiers, contact openings are etched into the silicon dioxide layer. Further details of the SOIPIX technology can be derived from the cited publication. The SOIPIX technology has the potential for manufacturing compact detector systems having very small pixels in a cost-efficient way. However, up to now only pin diode arrays are used as sensors. Due to the mentioned disadvantages, the use of APD arrays is not taken into consideration.

In view of the described problems, it is an object of the invention to provide an APD array which has a good position resolution at a high fill factor.

The object is achieved by an avalanche photodiode array according to claim 1 and claim 9. Further developments of the invention are given in the dependent claims.

Further features and utilities of the invention will become apparent from the description of embodiments based on the attached figures.

FIRST EMBODIMENT

Figure 1:
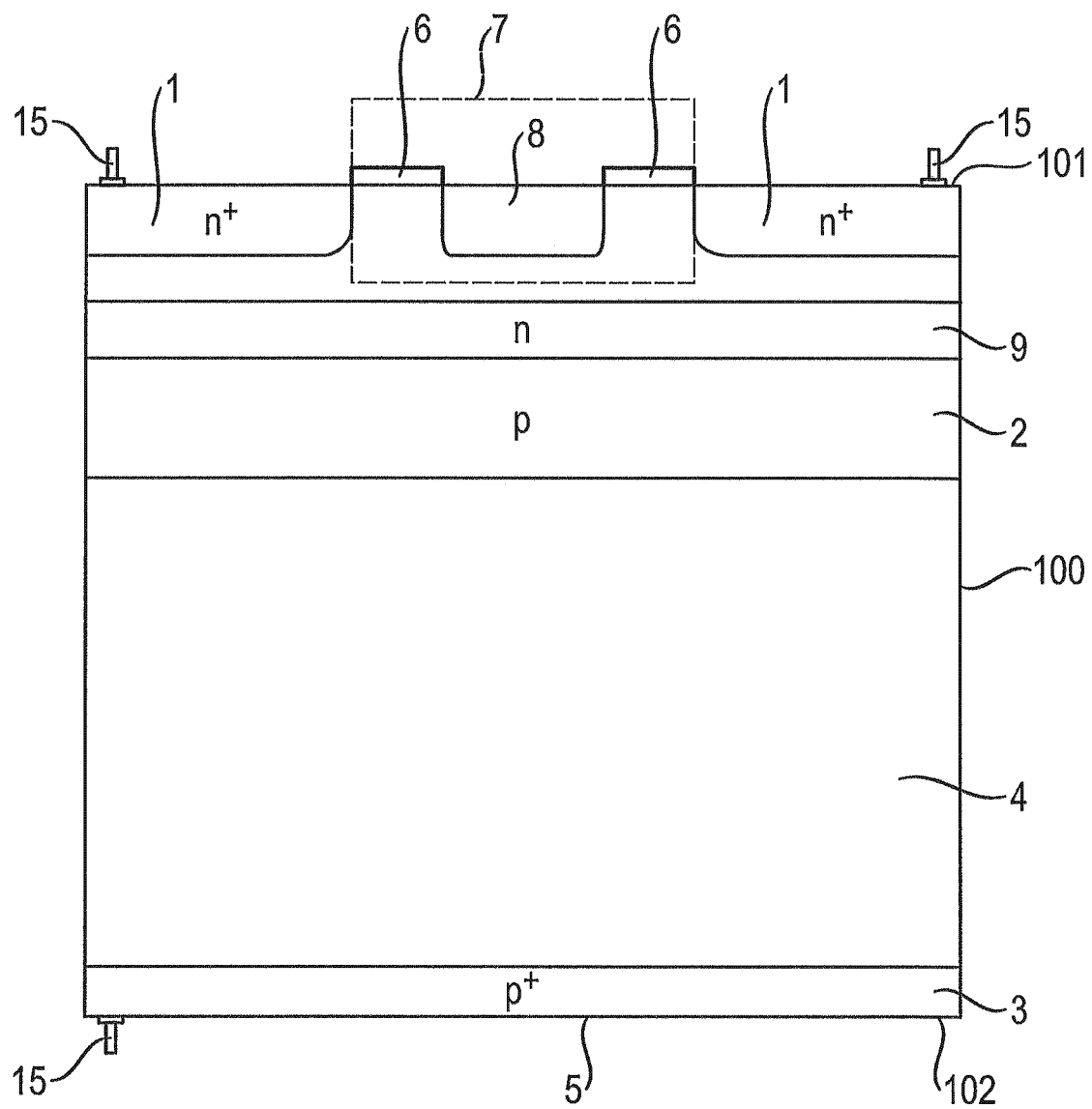
FIG. 1 shows schematically a sectional view of a detail of an avalanche photodiode array of a first embodiment perpendicular to the main surfaces of the avalanche photodiode array.
Figure 6:
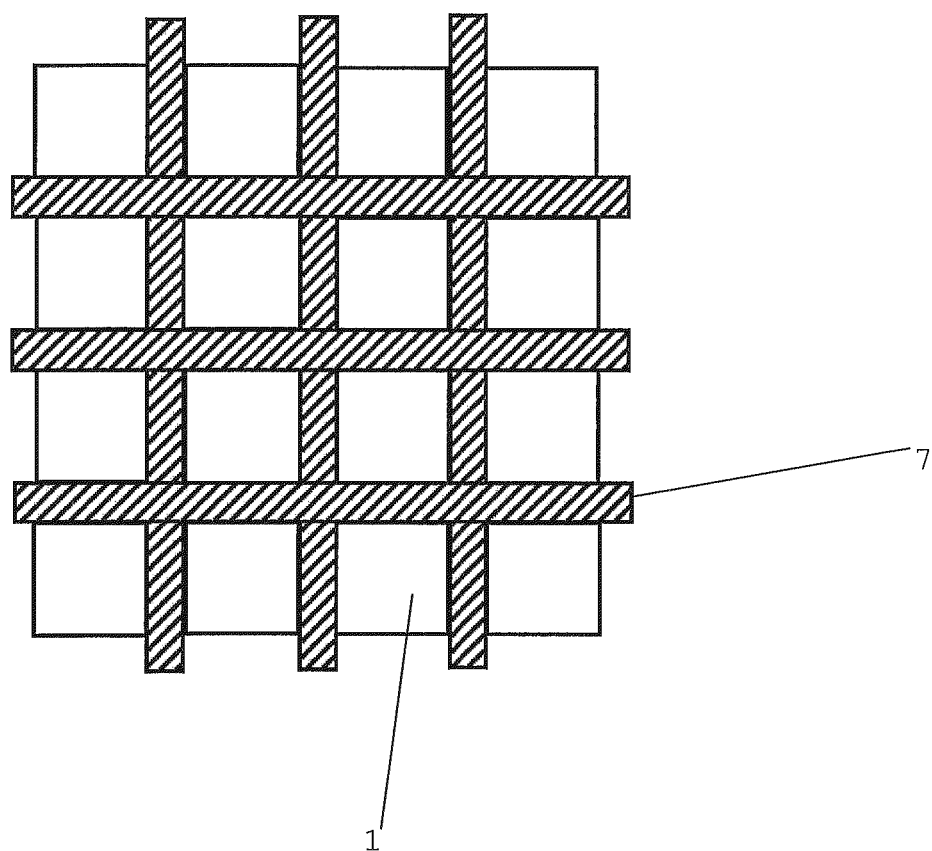
FIG. 6 shows a detail of an exemplary APD array according to the invention in a top view of the first main surface 101.
Figure 7:
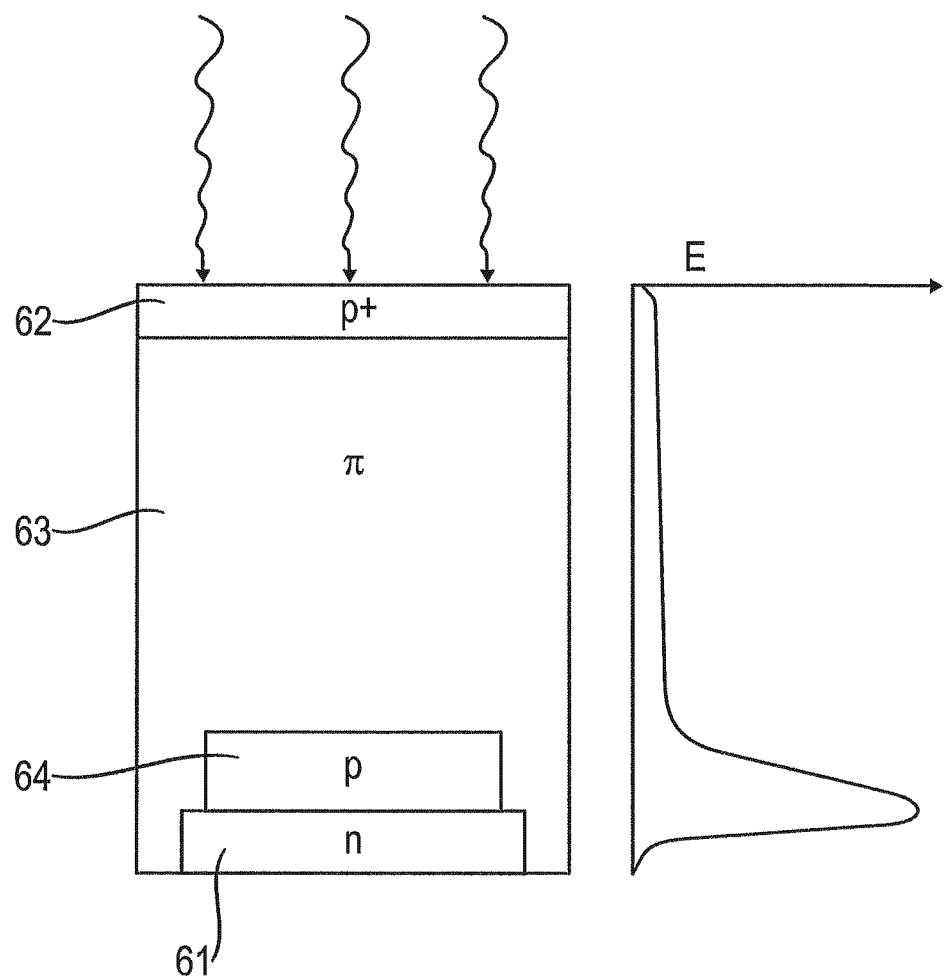
FIG. 7 shows schematically the basic construction of a Reach-Through-avalanche-photodiode and the field strength distribution perpendicular to the chip front side and back side in operation.

FIG. 1 schematically shows a section perpendicular to the main surfaces of an avalanche photodiode array of a first embodiment. In the section, a semiconductor substrate 100 (e.g. a high-ohmic silicon substrate) having a first main surface 101 (chip front side or chip top side) and a second main surface 102 (chip backside or chip bottom side) can be seen, in which semiconductor substrate the avalanche photodiode array is formed. In the portion of a Reach-Through-avalanche photodiode array that is shown as example, two neighboring pixels (image cells) consisting of two anode regions 1 together with the pixel insulation region 7 separating both anode regions from each other, wherein both pixels in the figure evenly share the pixel insulation region, are shown. Thus, each pixel comprises an anode region 1 and half of the pixel insulation region delimiting the anode region from the neighboring pixels. For example, for quadratic anode regions all pixel insulation regions 7 together would form a cross grid as is illustrated by means of FIG. 6 which shows a detail of an APD array in a top view of the first main surface 101. It is self-evident that in an APD array all pixel insulation regions 7 have to be connected to each other such that all anode regions 1 are insulated from one another. The design of the pixel insulation region 7 at the "crossings" of the cross grid shown in FIG. 6 is for example analogous to the design of the pixel insulation regions 7 according to the definition just given.

At the edge of the array, measures have to be taken in order to avoid that the behavior of the edge pixels differs too much from the behavior of the pixels in the center of the array. In particular, suitable protective structures (such as guard rings) must also be provided there for a controlled lowering of the field in order to avoid undesired charge carrier generation at this position. The mentioned measures are sufficiently known in the prior art, so that they are not discussed in detail here, particularly as the invention is not focused on the suitable design of the edge of the array.

While in FIG. 1 both anode regions 1 are formed at the chip front side or first main surface 101, at the chip backside or second main surface 102 a p-doped cathode region 3 is formed which in the following will also be designated as radiation entrance side region 3 as the second main surface 102 during operation is the radiation entrance window 5. Though the cathode region 3 should preferably extend across the whole area of the APD array, it does not result from this fact that it has to be uniform across the whole area. It is for example conceivable that the cathode region 3 is formed only at the edge of the APD array such that it forms an ohmic contact when being covered by a cathode electrode (in FIG. 1 designated with reference number 15). In the remaining area, the cathode region can be formed such that it is very flat in order to optimize the quantum efficiency of the radiation conversion. Also, further optical cover layers for improving the quantum efficiency may be present on the second main surface 102 even if this is not shown in the figure.

Reference number 4 designates a weakly p-doped or n-doped or only intrinsically conducting drift region 4, reference sign 2 designates a p-doped multiplication layer. In SLIKs, the drift region would be lower-ohmic than in RT-APDs as in the latter case at least parts of the drift region take over the function of the multiplication layer.

Even if this is not directly apparent from FIG. 1, in a preferred implementation of the invention the multiplication layer 2 extends in a plane parallel to the first main surface 101 across the whole area of the APD array. Thereby, an amplification as homogenous as possible can be provided in a plane parallel to the first main surface 101 in the whole APD array. Further preferably, the multiplication layer 2 extends as homogenously as possible below the anode regions 1 and the pixel insulation regions 7. Thereby it is avoided that due to variations of the doping of the multiplication layer 2 in a plane parallel to the first main surface 101 variations of the electric field in a plane parallel to the first main surface 101 are generated, wherein such variations of the electric field lead to inhomogeneities of the amplification.

Above of the multiplication layer 2, meaning with regard to the direction perpendicular to the main surfaces, an n-doped field reduction layer 9 is arranged below the anode regions 1 and the pixel insulation regions 7. As in the case of the multiplication layer 2, in a preferred implementation the field reduction layer 9 extends in a plane parallel to the first main surface 101 across the whole area of the APD array. In the same way, the field reduction layer 9 preferably extends as homogeneously as possible below the anode regions 1 and the pixel insulation regions 7.

In order to provide for a homogenous amplification in the whole APD array, a lateral distribution of the electric field below the n-doped anode regions 1 and below the pixel insulation regions 7, which is as homogeneous as possible, is necessary. This objective is achieved by the presence of the field reduction layer 9 which acts like an intermediate anode having a large area. As the field reduction layer 9, which is completely depleted in the operation of the APD array, reduces the electric field up to a value far below the onset of carrier multiplication, the field reduction layer 9 also provides for a significant reduction of the electric fields at the edges of the anode regions and at the pixel insulation regions 7. Thereby, breakdowns at the edges of the pixels are avoided and the long-term stability is improved as the injection of high energy ("hot") charge carriers into the insulator at the semiconductor insulator interfaces is avoided.

There are different possibilities for the design of the pixel insulation regions 7, each of which can be applied in combination with the mentioned field reduction layer 9: As can be seen in FIG. 1, a p-doped stop region 8 is formed in the pixel insulation region 7 at the first main surface 101. Such stop region serves for a lateral insulation of the n-doped anode regions 1 from each other. By such stop region 8, a connection of anode regions 1 with each other by an electron layer that forms due to positive fixed charges at the silicon-silicon dioxide-interface is prevented (here, it is assumed that the semiconductor substrate at the anode side is covered with an insulating layer in the form of a field oxide).

While in FIG. 1 the stop region 8 is at a distance to the anode regions 1 (with an insulation layer 6 above the intermediate space between the stop region 8 and the anode regions 1), alternatively or in addition the p-doping can be formed also in the whole pixel insulation region 7 between two anode regions 1. The latter approach is named "p spray insulation" as in this case the p-doping is weaker by orders of magnitude than the high n-doping of the anodes and therefore can be introduced in a large area and unstructured, respectively, into the first main surface 101. Compared to the presence of a stop region 8, this approach has, inter alia, the advantage that intermediate spaces between the stop region 8 and the anode regions 1 are omitted and the width of the pixel insulation region 7 is accordingly smaller.

A further possibility for an insulation of the anode regions 1 from each other is to insert a MOS insulating structure in the pixel insulation region 7 between each two anode regions 1 instead of the stop region 8 or the p-spray insulation. In fact it is sufficient to form such MOS insulating structure only in a part of the pixel insulation region 7 between two anode regions 1 such that an insulation of the adjoining anode regions from each other is guaranteed (for quadratic anode regions 1 e.g. in the form of a cross grid). However, the MOS insulating structure may of course also take up the complete pixel insulation region 7.

A previously mentioned MOS insulating structure is constructed such that a conductive insulated control layer (separated from the semiconductor substrate by an insulating layer) is arranged above the first main surface 101. A potential relative to the anode regions is applied to the conductive insulated control layer. The potential is able to deplete the electron accumulation layer which forms at the silicon-silicon dioxide-interface due to positive fixed charges, so that as a result the anode regions 1 are insulated from one another.

The inventors recognized an even further possibility of designing the pixel insulation regions 7. When forming the stop region 8 and when forming the spray insulation, it is possible to use an n-doping instead of a p-doping. At first this appears to be absurd as an electron layer connecting the anode regions 1 with each other shall in fact be avoided. However, the inventors recognized that the negative space charge of the multiplication layer, which in operation is created by applying a reverse voltage between the anode regions 1 and the cathode region 3, provides for a complete depletion of the semiconductor in the pixel insulation region 7. Accordingly, in fact one can do without the three previously mentioned additional insulation measures. However, a combination of the n-doping with the above-mentioned MOS insulation structure may be advantageous in order to react by means of its potential to doping variations caused by the technology or in order to implement a rather precise adjustment of the avalanche amplification below the pixel insulation region. However, from the complete depletion of the semiconductor in the pixel insulation region 7 only by way of the mentioned reverse voltage there will also result a lowering of the potential with respect to the anode regions, which leads to field inhomogeneities and thus to a lower amplification below the pixel insulation region 7, meaning to a lower signal at these positions. Here, by introducing an n-doping into the pixel insulation regions it is possible to counter the field inhomogeneities. Which doping parameters do have to be selected here in detail, depends on the doping parameters of the multiplication layer 2 and of the field reduction layer 9 as well as on the reverse voltage applied in operation and can be found by the skilled person in the individual case easily by a device simulation.

In the following, the steps for manufacturing an inventive APD array will be outlined, wherein steps that are not explicitly mentioned are identical or analogous to those applied in the manufacture of APD arrays known in the prior art.

In order to form the cathode region 3, acceptors (e.g. boron) are introduced into a usually high-ohmic semiconductor substrate (e.g. 2 kOhm-cm) at the second main surface (thus the backside) thereof. At the opposed first main surface, the anode regions 1 are formed by introducing donors (e.g. As or P) with a high dose. They should be introduced in both cases preferably by implantation. The dose should be such that the formation of an ohmic junction with the contacts (depending on the metallization that is used) is possible. In most cases, for this the dose must be between $10^{14}/cm^2$ and $10^{16}/cm^2$. In the figures, reference number 15 generally designates a contact, independent of its functional purpose or its position. As already mentioned above, in the cathode region 3 it is also possible to choose a different dose outside of the contact region, in particular also a lower dose (down to e.g. $10^{12}/cm^2$). In order to achieve a high detection efficiency of photons that have a small absorption length, meaning light in the UV range or soft X-rays, apart from the direct implantation of boron into silicon there are also other possibilities of technologically implementing the formation of the cathode. Such possibilities are covered by the term "thin entrance window". For example, the growing of a very thin silicon epitaxial layer having a high boron concentration or the epitaxial growing of pure boron layers or the deposition of very thin polysilicon layers having also a high boron concentration, are known. The invention is not limited to a specific technological embodiment of the cathode region.

The multiplication layer 2 can e.g. be formed by means of a p-doped epitaxial layer. Here, the thickness of the epitaxial layer (e.g. 2-50 μm) depends on the doping that has been chosen (e.g. between $10^{14}/cm^3$ and $5 \cdot 10^{15}/cm^3$) and should be the lower the higher the doping.

The way in which the multiplication layer is formed has an effect on the electric field distribution when the APD array is operated:

A constant p-doping of the multiplication layer 2, e.g. inside of an epitaxial layer, results in a linear increase of the electric field with a maximum at the junction of the multiplication layer 2 and the n-doped field reduction layer 9. However, such inhomogeneous vertical field distributions lead to a poor k factor and to an increased excess noise, because the holes do considerably contribute to the multiplication at least at the field maximum. More homogenous vertical electric field can be implemented by creating the multiplication layer 2 by means of ion implantation with high energies. If in such a case the p-doping decreases considerably between the concentration maximum and the n-doped layer 9, the vertical electric field in this region is nearly constant.

When the multiplication layer 2 is formed e.g. by ion implantation of boron with high energy, the dose should be smaller than the one for the cathode region 3. As the multiplication layer 2 shall be located closer to the first main surface 101, the implantation is carried out at the first main surface 101, e.g. with an energy between 500 keV and 12 MeV and a dose between $10^{12}/cm^2$ and $4 \cdot 10^{12}/cm^2$.

The deeper the maximum of the implantation, meaning the further the same is away from the first main surface, the more extended the multiplication layer will be and the lower the electric field can be set in order to achieve a certain amplification. Small electrical field strengths on the other hand lead to a small k factor and thus, as with SLIK-APDs, to a small excess noise.

The field reduction layer 9 can also be introduced by means of ion implantation (e.g. of P), wherein the implantation is carried out at the first main surface 101 with high energy. The energy has to be set such that the field reduction layer 9 is adjoining to the multiplication layer 2 at the side of the first main surface 101 (e.g. between 400 keV and 1 MeV). Preferably, the dose is by two to three orders of magnitude smaller than the one for the formation of the anode regions 1, e.g. in the range between $7 \cdot 10^{11}/cm^2$ and $3 \cdot 12^{12}/cm^2$. Here, the dose is set such that the electric field is reduced by a large proportion in the field reduction layer 9, wherein, however, the layer stays depleted in sensor operation.

Second Embodiment

Figure 2:
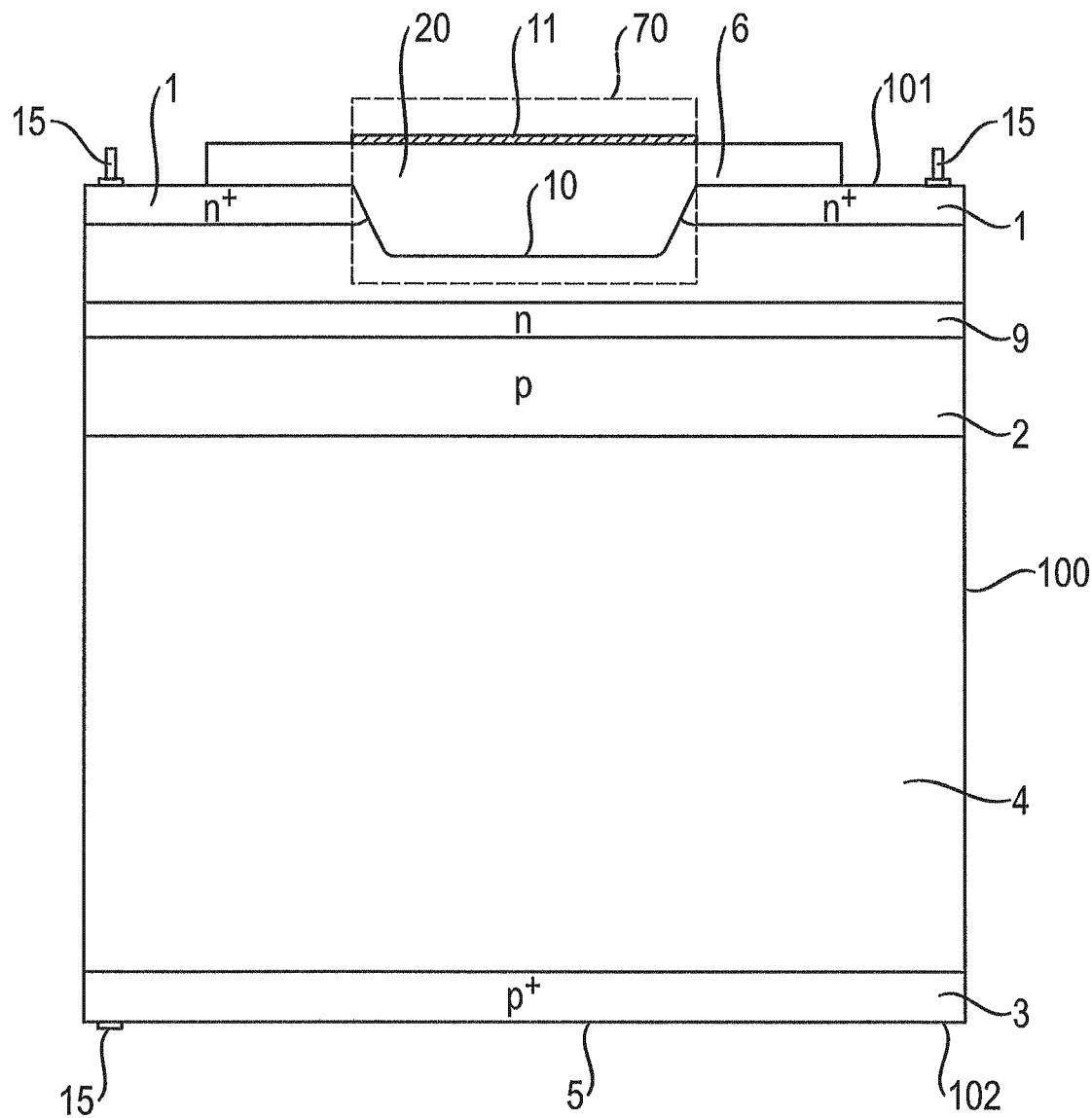
FIG. 2 shows schematically a sectional view of a detail of an avalanche photodiode array of a second embodiment perpendicular to the main surfaces of the avalanche photodiode array.

The sectional view of a second embodiment of an inventive APD array that is shown in FIG. 2 is very similar to the sectional view of FIG. 1. In particular, the same reference numbers refer to same features that are identical to FIG. 1.

The difference of the second embodiment to the first embodiment consists in a different implementation of the pixel insulation region so that the same has reference number 70 in FIG. 2.

The p-doped region between the anode regions 1, which has been described with respect to the first embodiment, meaning the stop region 8 or the p spray insulation, can have negative effects on the fill factor. As the diode between the n-doped anode regions 1 and the p-doped region has to be reverse biased for a separation of the anode regions from each other, the potential of the p-doped region is more negative than the one of the adjoining anode regions 1. This leads to a more negative potential of the portion of the multiplication layer 2 located below the p-doped region. As a result, the electric field and thus the amplification at this portion are lowered. The same applies to the above-mentioned MOS insulation region. Accordingly, the amplification across the APD array will be no longer homogenous, even if the field reduction layer 9 is able counteract this inhomogeneity.

For some applications, the homogeneity of the amplification does only play a minor role. In particular, if the dimensions and areas, respectively, of the anode regions 1 are not too small, i.e. large with respect to the width and area, respectively, of the pixel insulation regions, signal losses that occur in the pixel insulation regions can often be neglected. Therefore, for such applications the pixel insulation regions that were described in combination with the first embodiment can be used. On the other hand, there are applications in which a high position resolution, thus small pixels, or a good fill factor are necessary. For example, in spectroscopy, signal losses at the pixel boundaries are troublesome. For these applications the APD arrays of the second embodiment are particularly suited.

As shown in FIG. 2, in the second embodiment a recess or depression 20 is formed in the semiconductor substrate 100 in the pixel insulation region 70. This recess 20 is filled with an insulator 6, for example $SiO_2$. When during operation of the APD array the region below the recess 20 is completely depleted, this will provide for a sufficient insulation of the anode regions 1 from one another. The interface 10 between the insulator 6 and the semiconductor substrate 100 at the bottom side of the recess 20 thus should be located in a depth in which during operation the region below the anode regions 1 is depleted. Therefore, the anode regions 1 which are not depleted should be located higher than the depth position of the interface 10, meaning closer to the first main surface 101. Due to the exponential relationship between potential and charge carrier density, a potential difference of much less than 1 V with respect to the anode regions 1 is already sufficient for suppressing a parasitic electron channel at the interface 10. In order to provide for a homogenous amplification, the potential at the interface 10, however, should not be too negative.

The width of the pixel insulation regions 70 should be preferably small. Thereby, the potential difference between the interface 10 and the regions below the anode regions 1 laterally adjoining it in the depleted semiconductor is kept small, thus providing for a homogenous charge collection and amplification. At the same time this keeps the area proportion of the pixel insulation regions small, which also has positive effects on the fill factor. A further advantage of narrow pixel insulation regions lies in the fact that the proportion of the surface leakage current that is generated at the Si—$SiO_2$ interface 10 is kept small. To be specific, the proportion of holes of the surface generation current is also amplified in the multiplication layer 2 and in particular enhances noise.

In a preferred implementation of the second embodiment, the potential of the interface 10 is adjusted by means of a conductive control layer 11 (e.g. made of metal or polysilicon) on the surface of the insulator 6 by means of the MOS effect. If the potential is adjusted along an imaginary line extending the interface into the adjacent semiconductor layers below the anode regions 1 (meaning parallel to the first main surface) such as to be nearly constant, also the potential distribution and field distribution parallel to the semiconductor surface will be very homogenous, leading to a very uniform amplification in the whole APD array. A conductive control layer 11, which is located between the anode regions and surrounds each anode region will then form a grid which at the edge of the APD array can be preferably set to a fixed potential.

Figure 3:
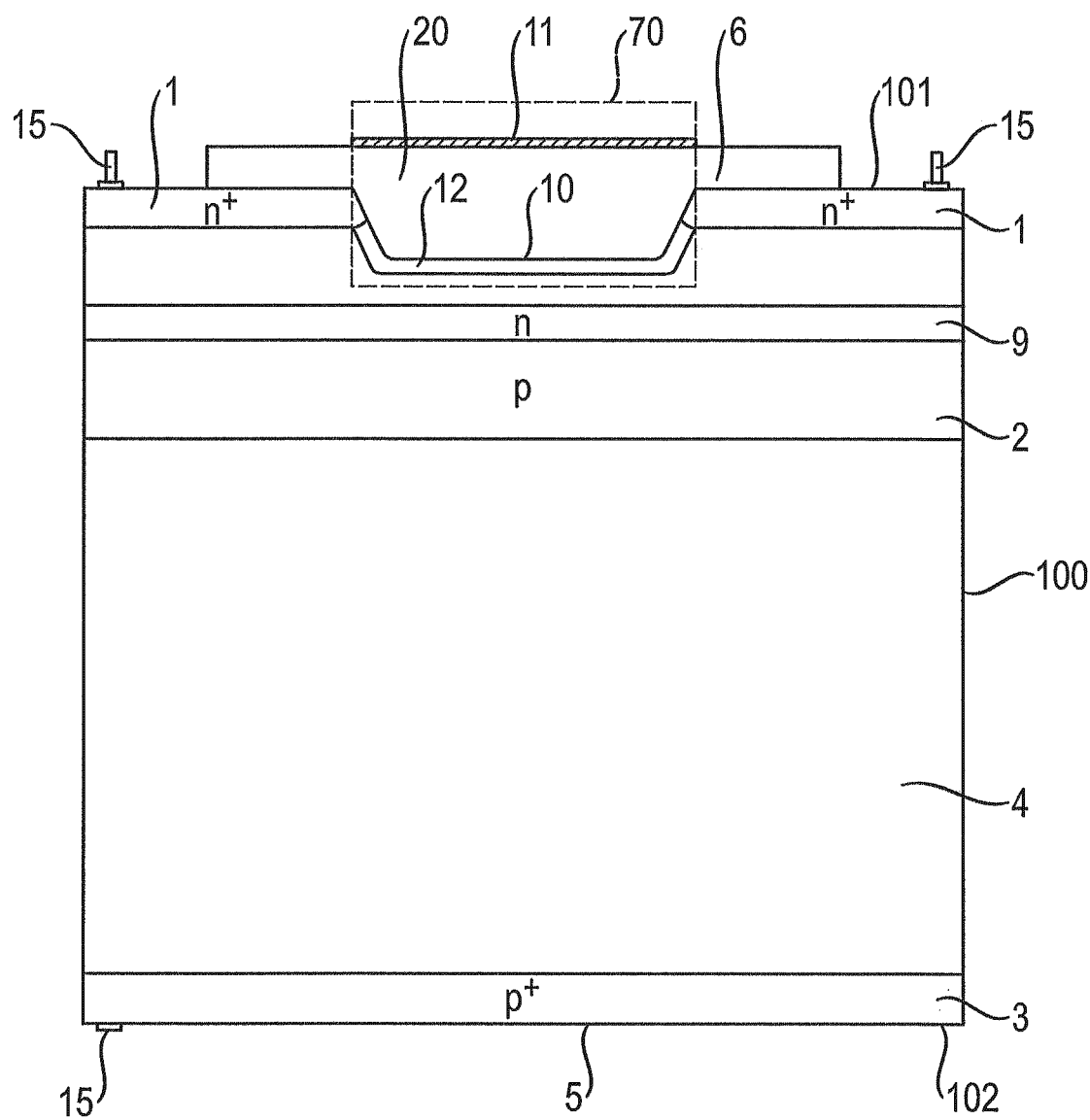
FIG. 3 shows schematically a sectional view of a detail of an avalanche photodiode array of a modification of the second embodiment perpendicular to the main surfaces of the avalanche photodiode array.

A further preferred implementation of the second embodiment is shown in FIG. 3. Here, alternatively or in addition to the conductive control layer 11, an n-doped interface doping layer 12 exists immediately below the interface 10. Here, the idea in the background is that a voltage at the metal contact of an MOS structure can be converted into an interface charge via the capacitance of the MOS structure. In operation, with a reverse voltage applied between the anode regions and the cathode region, the interface doping layer 12 is also depleted. An advantage with respect to the design shown in FIG. 2 is that there is no control layer grid and thus there is also no parasitic capacitance between the anode regions 1 and the control layer 11.

Usually, the potential at the interface 10 can be adjusted in a much more precise and flexible way by means of the conductive control layer 11. A combination of a conductive control layer 11 with an interface doping layer 12, as shown in FIG. 3, can be advantageous, when the necessary voltage that is to be applied to the conductive control layer 11 shall be reduced.

The charge carriers generated by avalanche multiplication alter the space charge in the multiplication layer, in particular after electrons and holes have been separated by the electric field. The electrons will drift with high speed to the nearby anodes and after that do no longer contribute to the space charge. The holes have a slightly smaller mobility and will drift the longer way to the cathode. Its influence on the space charge is higher. For a short time, they will compensate a part of the negative space charge of the acceptors located in the multiplication layer and thus reduce the electric field and the amplification of the APD. Due to geometry, the capacitive coupling of the generated charge carriers below the anode regions and below the pixel insulation regions differs slightly. This is due to the fact that the distance between the multiplication layer and the anode regions which are at a fixed potential is smaller than the distance between the multiplication layer and the conductive control layer. This is assisted by the larger relative permittivity of silicon as compared to silicon dioxide. It results that the potential change and change of the field strength in the multiplication layer due to the generated charge carriers is slightly smaller below the anodes than below the pixel insulation regions. Such space charge effects can be corrected by means of the conductive control layer 11 in that the electric field in the multiplication layer is slightly increased by a positive voltage at the control layer.

Even if in each of FIGS. 2 and 3 a field reduction layer 9 is shown, such a field reduction layer 9 need not necessarily be present in APD arrays of the second embodiment. The advantage of an improved fill factor brought about by the second embodiment is already achieved without the presence of the field reduction layer 9. Of course, however, for a combination of the first and second embodiments, thus for the presence of the field reduction layer 9 in the examples according to the second embodiment, even larger advantages can be achieved, e.g. a more homogenous amplification over the area of the APD array effected by the field reduction layer 9.

The deepening of the interface 10 with respect to the first main surface 101 can be technologically implemented with the local oxidation process (LOCOS) known from microelectronics. When using the LOCOS process, the known bird's beak region will occur in which the oxide thickness increases starting from the edge of the anode regions 1 leading to a gradual deepening of the interface 10 (FIG. 2). The reach-through of the potential of the conductive control layer 11 to the interface 10 varies correspondingly. It is more pronounced in the edge regions of the LOCOS layer than in its center. This variation propagates to the multiplication layer 2 and leads to a small inhomogeneity of the electric field there. Such inhomogeneity can be decreased by applying an additional insulating layer onto the LOCOS layer as the relative differences in thickness are leveled. An alternative and additional, respectively, possibility for a leveling of the thickness differences of the insulator 6 is the formation of a planar surface as shown in FIG. 2 by a distinct planarization step. In order to improve the conformity of the reach-through of the potential of the conductive control layer 11 to the interface 10, it is also possible to thin the insulator 6 where it has its largest thickness (not shown in FIG. 2). Thereby, the reach-through of the potential of the control layer 11 to the multiplication layer 2 is increased, whereby also the effect of the above-described space charge effects is reduced.

The mentioned technological measures can be applied either individually or also in arbitrary combination and can be combined with the use of an interface doping layer 12. They are also not tied to the use of the LOCOS process. For example, it is also possible to deepen the interface 10 by an etching process instead of or in combination with the LOCOS process. If a shallow phosphorous doping is introduced into the pixel insulation regions 70 before the local oxidation (e.g. by means of an implantation with a dose between $3 \cdot 10^{11}/cm^2$ and $10^{12}/cm^2$), due to the segregation behavior of phosphorous at the silicon-silicon dioxide-interface 10 the dopants will move into the semiconductor in order to form there the interface doping layer 12.

Figure 4:
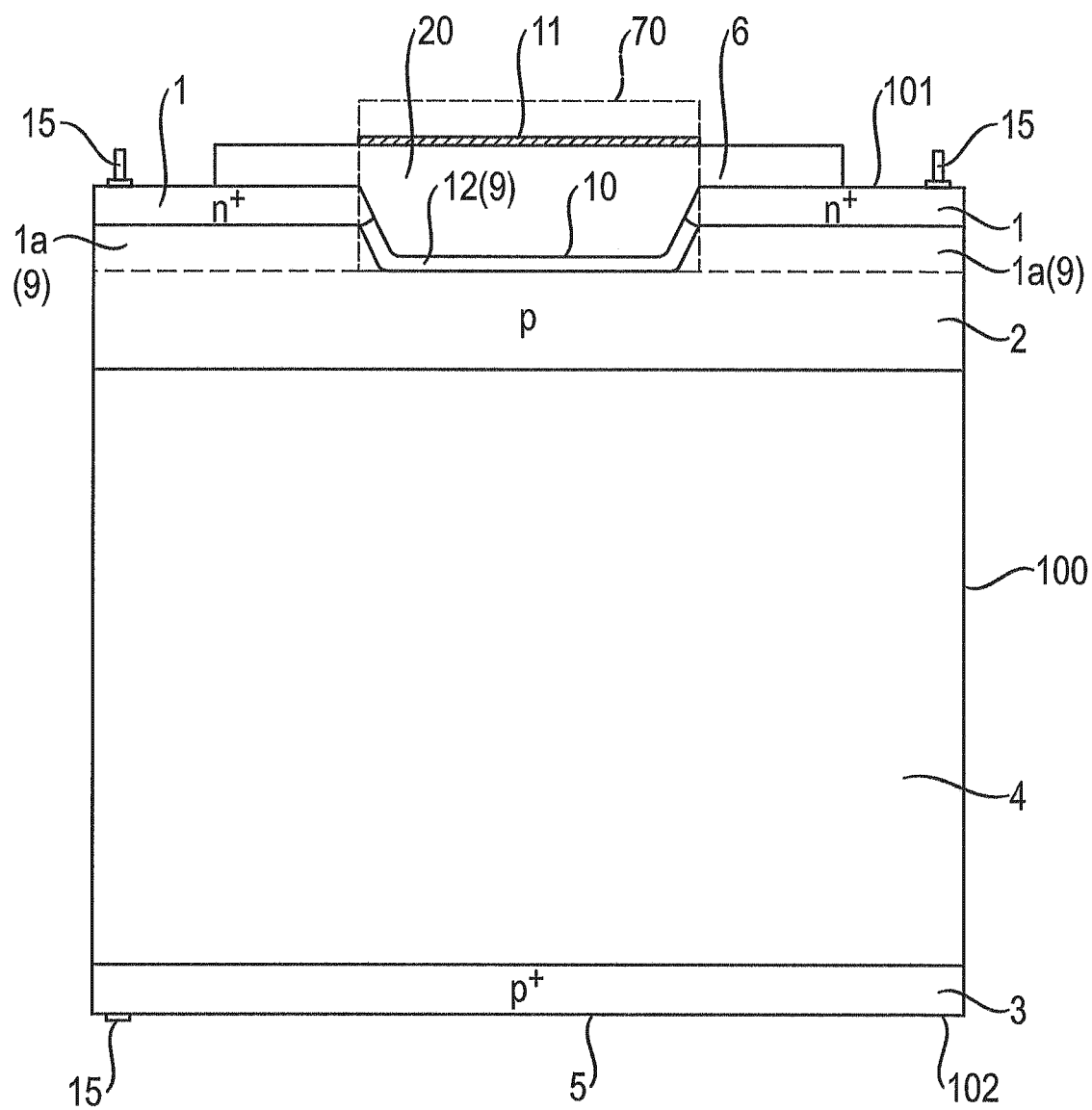
FIG. 4 shows schematically a sectional view of a detail of an avalanche photodiode array of a second embodiment perpendicular to the main surfaces of the avalanche photodiode array in order to explain a possible approach when manufacturing the same.

In order to make the technological process more cost-efficient, there is also the possibility of assembling the field reduction layer 9 from the n-doped interface doping layer 12 and the tails of the doping of the anode regions 1 laterally adjoining it. In this case, the n-doped field reduction layer 9 is not completely separated from the highly doped anode regions 1. Its doping may gradually change into the doping of the anodes. It can even be formed by a lower-doped tail 1a of the anode doping and may change laterally into the doping of the interface layer 12 (FIG. 4). The lower-doped tail 1a of the anodes and the interface doping layer 12 will then together form the field reduction layer 9. The advantage of such an approach is that the n-doped layer 9 is not created in a process step by ion implantation but is formed by means of diffusion from the anode regions 1 and by means of the described movement of the interface doping layer 12 during the local oxidation in the pixel insulation region 70. A damage of the silicon crystal which occurs during the formation of the field reduction layer 9 is thereby completely avoided. In order to avoid misunderstandings, it shall be emphasized here that the tails 1a of the anode doping that are completely depleted in the operation of the APD array are not regarded as parts of the anode regions 1.

Apart from setting the voltage at the conductive control layer 11 and/or the doping parameters of the interface doping layer 12, there are further technological possibilities of controlling the potential at the interface 10 and thus the homogeneity of the amplification. The potential difference between the interface 10 and the regions laterally adjoining it can be decreased by a deeper $SiO_2$—Si interface (thicker LOCOS layer) or by a shallower anode doping (doping with arsenic instead of phosphorous). Both measures will lead to a more negative potential under the anode regions 1 at the level of the $SiO_2$—Si interface and thus will expand the margin for adjusting a homogenous lateral electric field in the multiplication layer 2 while at the same time guaranteeing the electrical insulation of neighboring anode regions 1.

For the operation of the inventive APD array, it is advantageous, if the electric field strengths that occur are not so high. In such case, no amplification or only a small amplification of the hole current generated at the interface 10 will occur. Thus, SLIK-APD arrays are a preferred embodiment of the invention.

A uniform position-independent amplification, which exists when the sum of the signals of neighboring pixels is independent from the entrance position of the light signal at the backside of the diode, makes it also possible to realize very small pixels as they are used in pin diode arrays.

The multiplication region and the cathode region can be technologically implemented in the same way as in the first embodiment. Also, all statements made with respect to the first embodiment that are not related to the pixel insulation region may be transferred in the same way to the second embodiment.

FURTHER MODIFICATIONS

Modern pin diode arrays as they are currently used are connected to the read-out electronics directly by flip-chip technique. The minimum pixel sizes are in the range of approximately 50 μm×50 μm. On the one hand, this limit is due to the minimum distance between neighboring bump bonds which currently is in this range. On the other hand it is due to the area requirement of transistor circuits in the read-out chip. It is to be expected that the trend to a further miniaturization in microelectronics will continue, so that the request for still smaller pixels is foreseeable.

For some years detector systems have been developed in which the read-out electronics is monolithically connected to the sensors by the SOI technology (silicon on insulator). In this case, the bump bond technology which in comparison is expensive and requiring much space is dispensed with. Up to now, classical pin diode arrays have been used for this technology known as SOIPIX. Therefore, in the context of the present invention the idea arose to replace the classical pin diode arrays by APD arrays. Accordingly, with such an approach the field of application of detectors comprising APD arrays can be expanded due to the improved time resolution and the higher sensitivity. An application of the SOIPIX technology in combination with the inventive APD arrays is in particular advantageous because not only simpler amplifiers having less space or power requirements can be used due to the intrinsic amplification of the APD arrays, so that for e.g. smaller pixels for an improved position resolution are realizable. The present invention also allows an implementation of APD arrays having smaller pixels making it particularly interesting for a combination with the SOIPIX technology.

Figure 5:
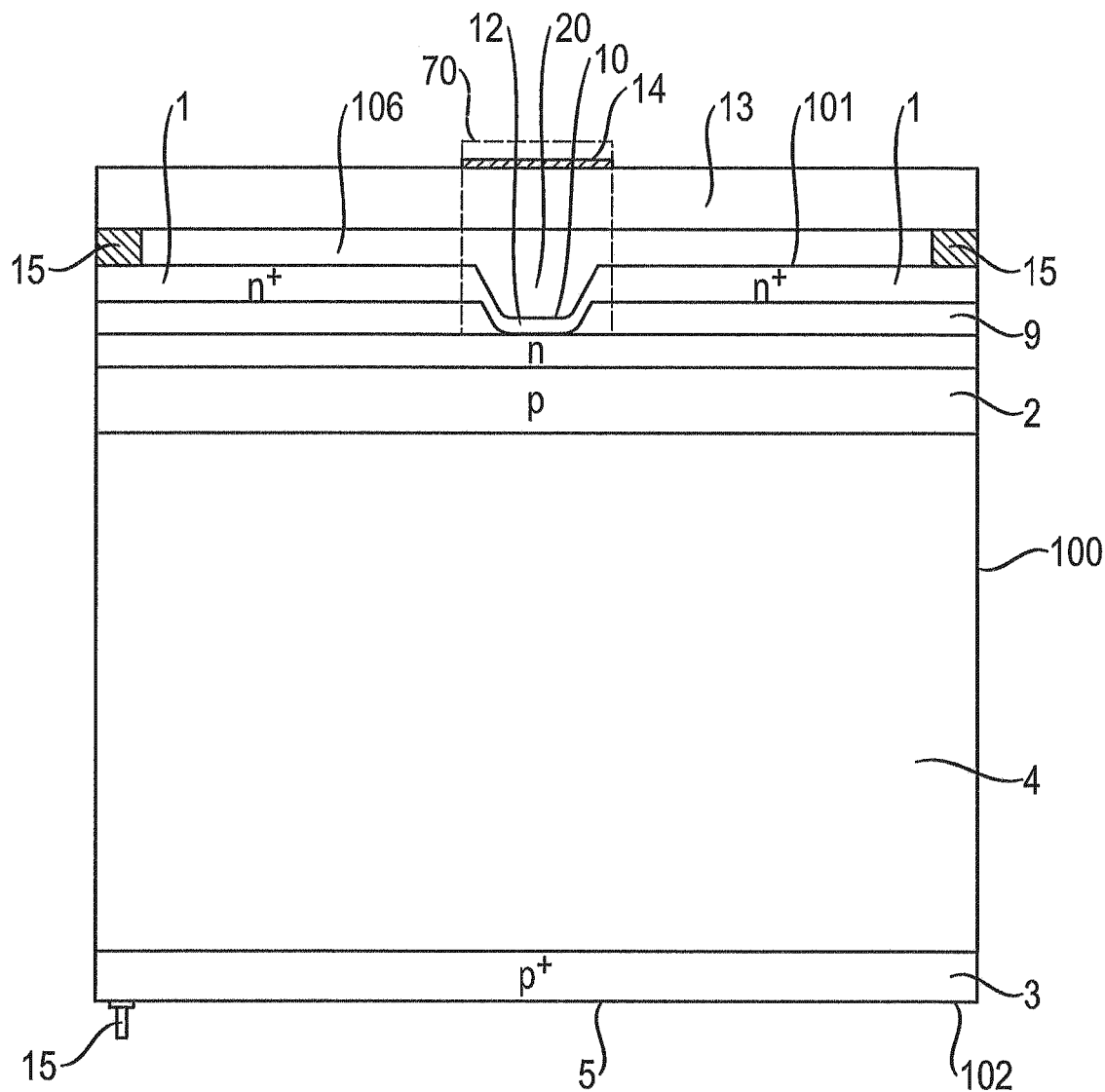
FIG. 5 shows by way of an example a schematic view of a monolithic connection of an APD array according to the invention to the read-out electronics according to the SOIPIX technology.

By way of example, FIG. 5 shows a schematic representation of a monolithic connection of an inventive APD array with the read-out electronics according to the SOIPIX technology. Here, the anode regions 1 are connected via contacts 15 with the inputs of the read-out amplifiers (which are not shown in detail) that are formed in the SOI layer (or the second semiconductor substrate) 13, wherein the first semiconductor substrate 100 and the second semiconductor substrate 13 are separated from one another by an insulation layer 106. The insulating layer 106 can be formed in one step together with the already mentioned insulating layer 6 that fills the recesses 20 and in particular may be made of the same material (e.g. $SiO_2$).

The above-mentioned conductive control layer 11 can be integrated into the SOI layer 13 as doped silicon layer 14, which capacitively controls the potential of the interface 10. Alternatively, the conductive control layer may also be formed as polysilicon or metal electrode. Due to the limited dielectric strength of the very thin oxides in the SOI electronics, the control voltage for the conductive control layer 14 may—if at all—be only in the range of a few volts. Here, it is beneficial to use the interface doping layer 12 for shifting the control voltage into a range suitable for the SOI electronics.

The invention is not limited to a specific shape of the individual anode regions. These may have e.g. a quadratic or rectangular shape. A different anode shape and/or anode size at different positions in the APD array is also conceivable, usually leading to a different shape and size of the pixels.

As is apparent from the above description, each of the possible designs according to the second embodiment can be combined with each of the possible designs according to the first embodiment.

Furthermore, it is clear that the present invention is directed to APD pixel arrays in which the pixel structure results from anode regions 1 that are separated from one another, whereas the cathodes of the individual diodes are all connected to one another in that the whole array has a homogenous unstructured cathode region 3. The missing pixel structure in the cathode region 3 formed in the second main surface 102 is advantageous because in the inventive APD pixel arrays the radiation is incident on the second main surface 102, which thus is the radiation entrance side in the detection.

Finally, it shall be mentioned that the invention can be applied in particular to silicon-based APD arrays and can preferably be applied in Reach-Through-APDs or SLIK-APDs that are suited for the detection of electromagnetic radiation. The inventive APD arrays can in particular be used for the detection of visible light, of UV radiation or of X-rays having an energy of the X-ray photons between 100 eV and 5 keV. The total wavelength range in which a detection can take place depends on the configuration of the radiation entrance window at the second main surface. The range for the above-specified radiation, when converted to wavelengths, comprises approximately the range between 0.2 nm to 700 nm.

In sensor operation, the described APD pixel arrays are substantially operated such that by the application of a reverse voltage between the cathode region 3 and the anode regions 1 the whole semiconductor between the cathode region 3 and the anode regions 1 except the cathode region 3 and the anode regions 1 itself as well as p-stop regions 8 or p-spray regions in the pixel insulation region 7, as the case may be, is depleted.

REFERENCE NUMBERS

1—anode region (n+-doped)—not depleted
1a—lower-doped tail of the anode (1)—depleted
2—multiplication layer (p-doped)—
3—cathode region (p+-doped)
4—drift region (weakly doped)
5—light entrance window
6—insulating layer (preferably $SiO_2$)
7—pixel insulation region
8—p-doping (p-stop)
9—n-doped field reduction layer (depleted)
10—bottom of the recess 20 and interface between insulating layer 6 and semiconductor substrate 100, respectively
11—conductive control layer
12—n-doped depleted interface doping layer in the insulation region 70
13—second semiconductor substrate with integrated read-out electronics—SOI layer
14—conductive control layer integrated in the second semiconductor substrate 13
15—contact
20—recess
70—pixel insulation region
100—semiconductor substrate
101—first main surface
102—second main surface

The invention claimed is:

1. An avalanche photodiode array for detecting electromagnetic radiation comprising
   a semiconductor substrate that comprises a first main surface and a second main surface which are opposed to each other,
   a plurality of n-doped anode regions formed at the main surface and separated from each other by pixel insulation regions,
   a p-doped cathode region arranged at the second main surface opposite to the anode regions,
   a drift region between the plurality of anode regions and the cathode region and
   a p-doped multiplication layer arranged below the plurality of anode regions and below the pixel insulation regions,
   characterized by an n-doped field reduction layer arranged below the plurality of anode regions and the pixel insulation regions and above the multiplication layer.

2. The avalanche photodiode array according to claim 1, wherein a p-doped semiconductor region is formed at the first main surface in a pixel insulation region located between each two anode regions.

3. The avalanche photodiode array according to claim 2, wherein the p-doped semiconductor region is at a distance to the anode regions adjoining thereto.

4. The avalanche photodiode array according to claim 1, wherein an n-doped semiconductor region is formed at the first main surface in a pixel insulation region between each two anode regions.

5. The avalanche photodiode array according to claim 1, wherein a pixel insulation region is formed at the first main surface between each two anode regions, in which pixel insulation region a recess extending from the first main surface into the depth of the semiconductor substrate is present.

6. The avalanche photodiode array according to claim 5, wherein at least the bottom of the recess is covered with an insulator, preferably the whole recess is filled with the insulator.

7. The avalanche photodiode array according to claim 6, wherein a potential control electrode is formed on the top of the insulator opposite to the bottom.

8. The avalanche photodiode array according to claim 6, wherein an n-doped interface doping layer is arranged below the bottom of the recess and immediately adjoining the insulator.

9. The avalanche photodiode array according to claim 1, in which the first main surface is connected to a second semiconductor substrate via an insulating layer and each of the plurality of anode regions is electrically connected through the insulating layer with one respective pixel of a read-out amplifier array formed in the second semiconductor substrate.

10. A method of manufacturing an avalanche photodiode array according to claim 5, wherein the recess is formed by a local oxidation of the semiconductor substrate by means of a LOCOS technique.

11. The method according to claim 10, wherein before carrying out the local oxidation, donors are introduced into the semiconductor substrate at the positions to be locally oxidized with a dose between $3 \cdot 10^{11}/cm^2$ and $10^{12}/cm^2$, preferably by means of implantation, at the positions to be locally oxidized.

12. The method according to claim 11, wherein an n-doped field reduction layer is formed below the plurality of anode regions and the pixel insulation regions and above of the multiplication layer by carrying out a diffusion step by which dopants that have been introduced into the anode regions diffuse so far into semiconductor substrate that the diffused dopants form the field reduction layer together with the interface doping layer.

13. An avalanche photodiode array for detecting electromagnetic radiation comprising
a semiconductor substrate comprising a first main surface and a second main surface opposed to each other,
a plurality of n-doped anode regions formed at the first main surface and separated from each other by pixel insulation regions,
a p-doped cathode region arranged at the second main surface opposite to the anode regions,
a drift region between the plurality of anode regions and the cathode region and
a p-doped multiplication layer arranged below the plurality of anode regions and below the pixel insulation regions,
characterized in that each of the pixel insulation regions comprises a recess extending from the first main surface into the depth of the semiconductor substrate.

14. The avalanche photodiode array according to claim 13, wherein an n-doped field reduction layer is arranged below the plurality of anode regions and below the pixel insulation regions and above the multiplication layer.

15. The avalanche photodiode array according to claim 13, wherein at least the bottom of the recess is covered with an insulator, preferably the whole recess is filled with the insulator.

16. The avalanche photodiode array according to claim 15, wherein a potential control electrode is formed at the top side of the insulator opposite to the bottom.

17. The avalanche photodiode array according to claim 15, wherein an n-doped interface doping layer is arranged below the bottom of the recess (20) immediately adjoining the insulator.

18. The avalanche photodiode array according to claim 13, in which the first main surface is connected to a second semiconductor substrate via an insulating layer and each of the plurality of anode regions is electrically connected through the insulating layer with one respective pixel of a read-out amplifier array formed in the second semiconductor substrate.

19. A method of manufacturing an avalanche photodiode array according to claim 13, wherein the recess is formed by a local oxidation of the semiconductor substrate by means of a LOCOS technique.

20. The method according to claim 19, wherein before carrying out the local oxidation, donors are introduced into the semiconductor substrate at the positions to be locally oxidized with a dose between $3 \cdot 10^{11}/cm^2$ and $10^{12}/cm^2$, preferably by means of implantation, at the positions to be locally oxidized.

* * * * *